United States Patent
Li et al.

(10) Patent No.: US 9,508,815 B2
(45) Date of Patent: Nov. 29, 2016

(54) SEMICONDUCTOR DEVICE AND METHOD FOR MANUFACTURING THEREOF

(71) Applicant: TAIWAN SEMICONDUCTOR MANUFACTURING CO., LTD., Hsinchu (TW)

(72) Inventors: Fu-An Li, Hualien County (TW); Cheng-Chun Tsai, Taipei (TW); Ting-Hsien Chen, Changhua County (TW); Mu-Kai Tung, Taichung (TW); Ben-Zu Wang, Taichung (TW); Po-Jen Shih, Tainan (TW); Hung-Hsin Liang, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/921,950

(22) Filed: Oct. 23, 2015

(65) Prior Publication Data

US 2016/0056255 A1    Feb. 25, 2016

Related U.S. Application Data

(62) Division of application No. 14/174,303, filed on Feb. 6, 2014, now Pat. No. 9,202,809.

(51) Int. Cl.
*H01L 21/28* (2006.01)
*H01L 29/423* (2006.01)
(Continued)

(52) U.S. Cl.
CPC ... *H01L 29/42376* (2013.01); *H01L 21/28088* (2013.01); *H01L 21/321* (2013.01); *H01L 21/32134* (2013.01); *H01L 21/823437* (2013.01); *H01L 21/823462* (2013.01); *H01L 27/088* (2013.01); *H01L 29/401* (2013.01); *H01L 29/4238* (2013.01); *H01L 29/4958* (2013.01); *H01L 29/4966* (2013.01);
(Continued)

(58) Field of Classification Search
CPC .................................................. H01L 21/28088
See application file for complete search history.

(56) References Cited

U.S. PATENT DOCUMENTS 6,025,627 A    2/2000 Forbes et al.
6,048,236 A    4/2000 Natsume
(Continued)

OTHER PUBLICATIONS

Bae, S. "Thickness optimization of the TiN metal gate with polysilicon-capping layer on Hf-based high-k dielectric" Micro. Elec. Engl. vol. 83 Iss. 3 Mar. 2006 99. 460-462 Mar. 2006.

(Continued)

*Primary Examiner* — Asok K Sarkar
*Assistant Examiner* — Grant Withers
(74) *Attorney, Agent, or Firm* — Maschoff Brennan

(57) ABSTRACT

A semiconductor device is provided including a substrate and a plurality of gate stacks. The gate stack includes a dielectric layer disposed on the substrate, a first capping layer disposed on the dielectric layer, a second capping layer disposed on the first capping layer, and a gate electrode layer covering the second capping layer. The first capping layer having a roughened surface may enhance the formation of the second capping layer. The second capping layer has a bottom portion and a sidewall portion, and the thickness of the bottom portion is formed to be greater than the thickness of the sidewall portion, so that the dielectric property of the second capping layer may be significantly improved. Further, a method for manufacturing the semiconductor device also provides herein.

20 Claims, 18 Drawing Sheets

(51) Int. Cl.
  *H01L 27/088* (2006.01)
  *H01L 21/8234* (2006.01)
  *H01L 29/49* (2006.01)
  *H01L 21/3213* (2006.01)
  *H01L 21/321* (2006.01)
  *H01L 29/40* (2006.01)
  *H01L 29/51* (2006.01)
  *H01L 29/66* (2006.01)

(52) U.S. Cl.
  CPC ............ *H01L29/51* (2013.01); *H01L 29/511* (2013.01); *H01L 29/66553* (2013.01); *H01L 29/517* (2013.01); *H01L 29/66545* (2013.01)

(56) References Cited

U.S. PATENT DOCUMENTS

| | | | |
|---|---|---|---|
| 6,921,711 | B2 | 7/2005 | Cabral, Jr. et al. |
| 7,390,709 | B2 | 6/2008 | Doczy et al. |
| 7,972,974 | B2 | 7/2011 | Ahn et al. |
| 7,981,740 | B2 | 7/2011 | Lenski et al. |
| 8,383,473 | B1 * | 2/2013 | Triyoso ............. H01L 29/66545 257/E21.444 |
| 8,623,730 | B2 | 1/2014 | Fan et al. |
| 9,147,736 | B2 * | 9/2015 | Chang ................... H01L 29/401 |
| 2004/0007747 | A1 | 1/2004 | Visokay et al. |
| 2006/0043492 | A1 | 3/2006 | Ahn et al. |
| 2006/0131675 | A1 | 6/2006 | Wang et al. |
| 2006/0148180 | A1 | 7/2006 | Ahn et al. |
| 2007/0048989 | A1 | 3/2007 | Ahn et al. |
| 2007/0218639 | A1 | 9/2007 | Dwikusuma |
| 2009/0121297 | A1 | 5/2009 | Dewey et al. |
| 2009/0236595 | A1 | 9/2009 | Atanackovic |
| 2010/0059808 | A1 | 3/2010 | Zheng et al. |
| 2010/0127335 | A1 * | 5/2010 | Niimi ................ H01L 21/28088 257/368 |
| 2010/0221906 | A1 * | 9/2010 | Metzger ............ H01L 21/28088 438/591 |
| 2010/0244141 | A1 | 9/2010 | Beyer et al. |
| 2010/0301427 | A1 | 12/2010 | Lenski et al. |
| 2010/0330808 | A1 | 12/2010 | Richter et al. |
| 2012/0132998 | A1 | 5/2012 | Kwon et al. |
| 2012/0139057 | A1 | 6/2012 | Goto |
| 2012/0326243 | A1 | 12/2012 | Huang et al. |
| 2013/0200467 | A1 | 8/2013 | Edge et al. |
| 2013/0240957 | A1 | 9/2013 | Lee et al. |
| 2014/0001543 | A1 | 1/2014 | Kim et al. |
| 2014/0061925 | A1 | 3/2014 | Kim |
| 2014/0077313 | A1 * | 3/2014 | Li ..................... H01L 21/82384 257/410 |
| 2014/0183642 | A1 | 7/2014 | Liang et al. |
| 2014/0246732 | A1 | 9/2014 | Chen et al. |
| 2014/0367801 | A1 | 12/2014 | Liu et al. |
| 2015/0076624 | A1 | 3/2015 | Liu et al. |

OTHER PUBLICATIONS

Rudenja, Sergei et al., "Corrosion Performance of Titanium-Based Composite Coatings Deposited by Physical Vapour Deposition", Proc. Estonian Acad. Sci. Engin., 2, 1, (1996), pp. 14-25.

* cited by examiner

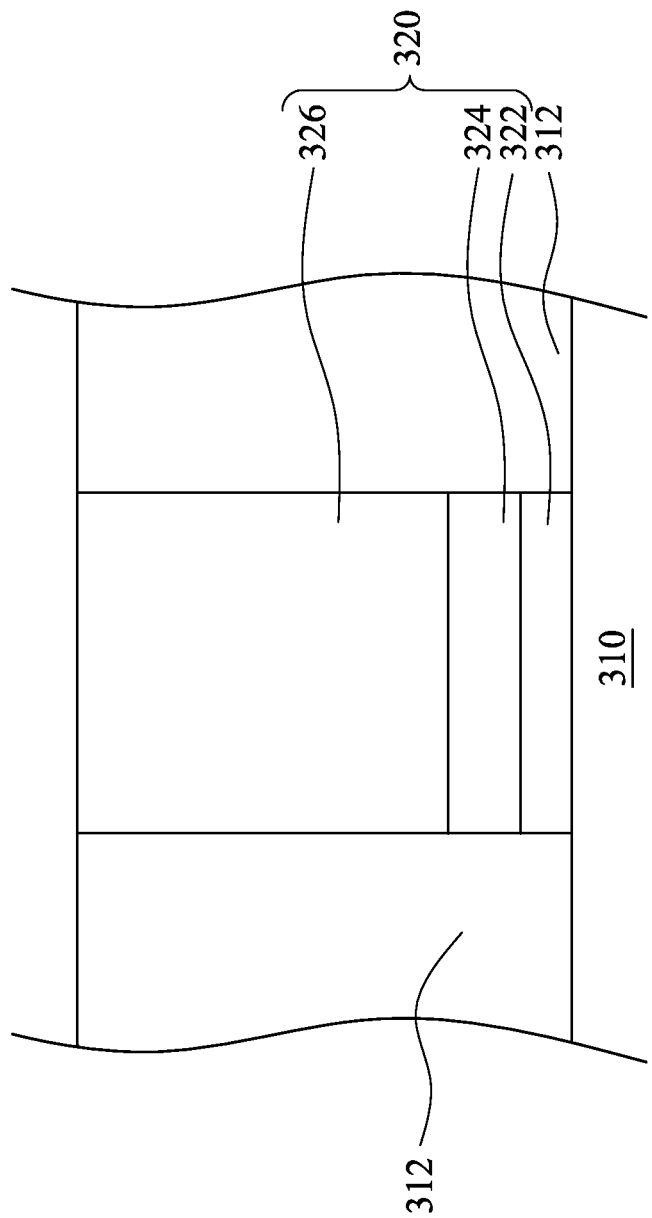

SEMICONDUCTOR DEVICE AND METHOD FOR MANUFACTURING THEREOF

BACKGROUND

Generally, the manufacturing process of a semiconductor device includes forming active regions in a semiconductor substrate, depositing and patterning various insulating, conductive, and semiconductor layers over the substrate in sequential steps. In the semiconductor device, field effect transistors (FETs) are widely used for switching, amplification, filtering, and other tasks related to both analog and digital electrical signals. Most common among these are metal-oxide-semiconductor field effect transistors (MOSFET or MOS), in which a gate stack is energized to create an electric field in an underlying channel region of the semiconductor substrate, by which electrons are allowed to travel through the channel between a source region and a drain region of the semiconductor substrate.

The gate stack includes gate dielectric layers as an electrical isolation between the gate electrode and the semiconductor substrate. With the reduction in the feature sizes of the semiconductor device, the reliability of the gate stack becomes increasingly more dependent on the insulating property of the gate dielectric layers. The gate leakage current may increase with the reduced thickness of the gate dielectric layers, Challenges are encountered during conventional processing of high-performance semiconductor devices with a reduced feature size. Accordingly, improvements in semiconductor devices and methods for fabricating the same are to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3E are schematic cross-sectional views at various stages of fabricating a semiconductor device, in accordance with some embodiments;

DETAILED DESCRIPTION

Figure 1A:
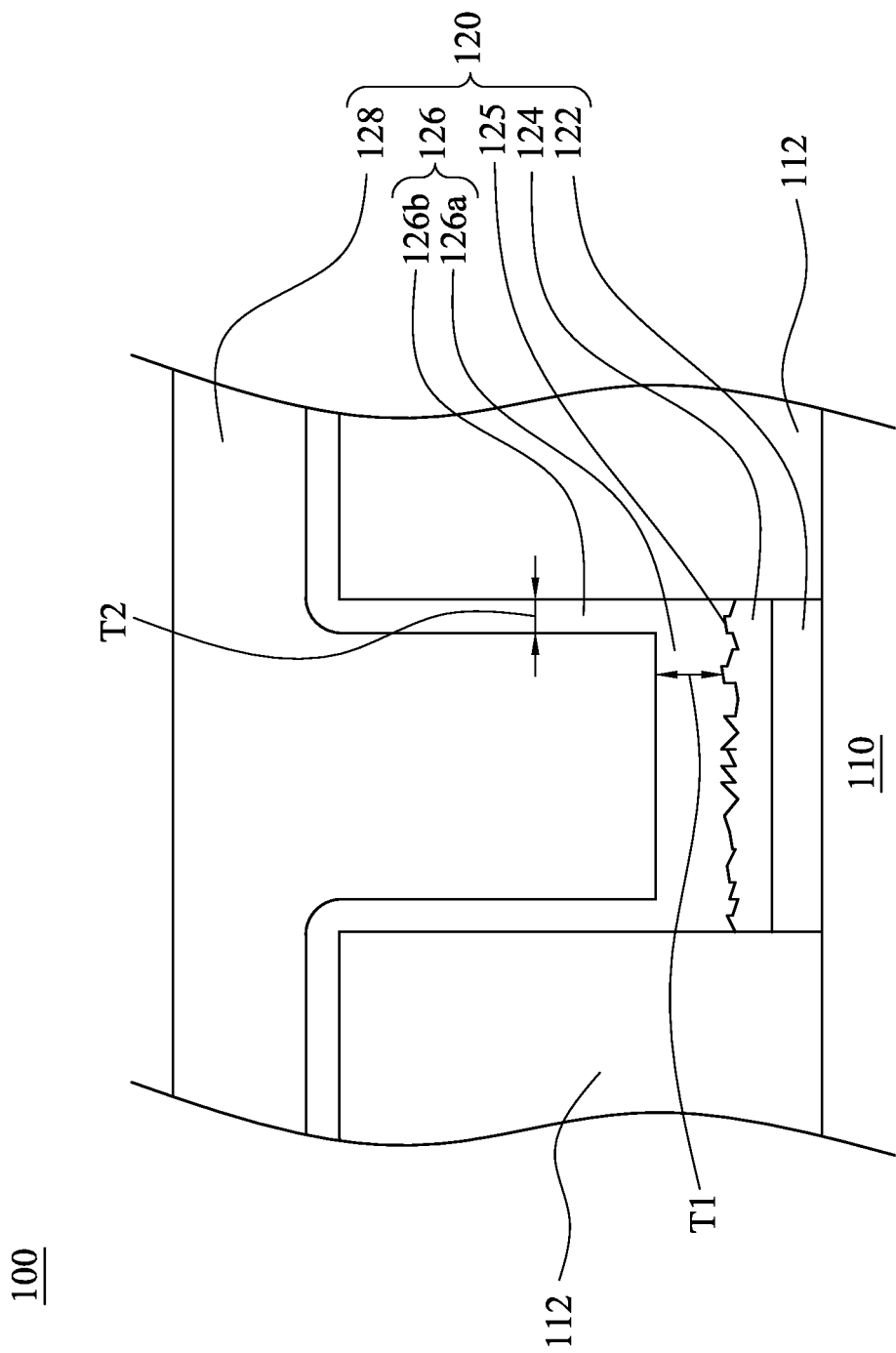
FIG. 1A is a schematic cross-sectional view of a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The singular forms "a," "an" and "the" used herein include plural referents unless the context clearly dictates otherwise. Therefore, reference to, for example, a dielectric layer includes embodiments having two or more such dielectric layers, unless the context clearly indicates otherwise. Reference throughout this specification to "one embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, the figures are intended; rather, these figures are intended for illustration.

In a conventional semiconductor device, gate stacks include gate dielectric layers as electrical isolation between the gate electrode and the semiconductor substrate. With the reduction in the feature sizes of the conventional semiconductor device, the thickness of the gate dielectric layers is reduced, but the gate leakage current may be increased. In this regard, a semiconductor device and a method for fabricating a semiconductor device are provided according to various embodiments of the present disclosure.

FIG. 1A is a schematic cross-sectional view of a semiconductor device 100 according to various embodiments of the present disclosure. The semiconductor device 100 includes a substrate 110 and a plurality of gate stacks 120, and one of the gate stacks 120 is enlarged showing in detail in FIG. 1A.

The substrate 110 includes a plurality of spacer pairs 112. In various embodiments of the present disclosure, the substrate 110 is a semiconductor substrate. The gate stacks 120 are disposed on the substrate 110, and individually disposed between the spacer pairs 112. Each one of the gate stacks 120 includes a dielectric layer 122, a first capping layer 124, a second capping layer 126 and a gate electrode layer 128.

The dielectric layer 122 is disposed on the substrate 110. In various embodiments of the present disclosure, the dielectric layer 122 is made from a high-k dielectric material including hafnium oxide (HfO$_2$), tantalum oxide (Ta$_2$O$_5$), zirconium oxide (ZrO$_2$) or aluminum oxide (Al$_2$O$_3$). The first capping layer 124 is disposed on the dielectric layer 122, and has a roughened surface 125. In various embodiments of the present disclosure, the first capping layer 124 is a first nitride layer such as a titanium nitride layer. The roughened surface 125 of the first capping layer 124 is by performing a wet-etching process in various embodiments of the present disclosure.

The second capping layer 126 has a bottom portion 126a and a sidewall portion 126b. The bottom portion 126a of the second capping layer 126 is disposed on the roughened surface 125 of the first capping layer 124, and the sidewall portion 126b of the second capping layer 126 is peripherally enclosed by the spacer pairs 112. In various embodiments of the present disclosure, the second capping layer 126 is a second nitride layer such as a tantalum nitride layer. In various embodiments of the present disclosure, the thickness of the bottom portion 126a is greater than the thickness of the sidewall portion 126b. In various embodiments of the present disclosure, the ratio of the thickness of the sidewall portion 126b to the thickness of the bottom portion 126a is in a range of about 0.5 to about 1.

The gate electrode layer 128 covers the second capping layer 126. In various embodiments of the present disclosure, the material of the gate electrode layer 128 is one selected from the group consisting of tungsten (W), copper (Cu), titanium (Ti), silver (Ag), aluminum (Al), titanium aluminide (TiAl), titanium aluminum nitride (TiAlN), tantalum carbide (TaC), tantalum cyanide (TaCN), tantalum silicon nitride (TaSiN), manganese (Mn), zirconium (Zr) and the combination thereof.

Figure 1B:
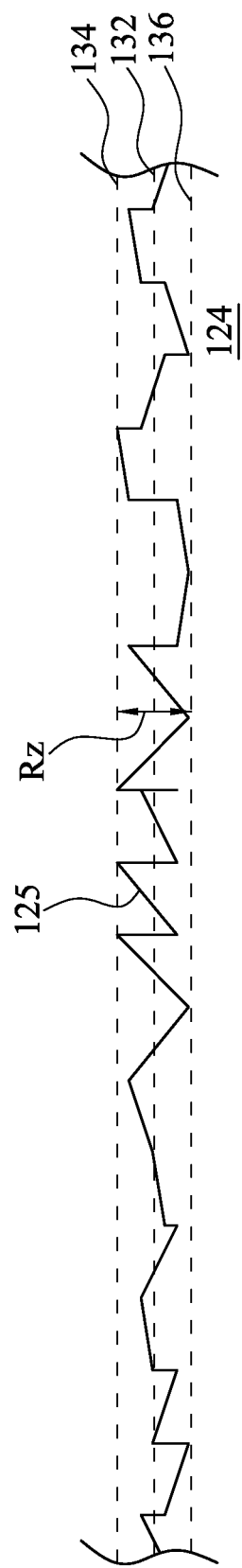
FIG. 1B is a schematic cross-sectional view of a roughened surface in a semiconductor device, and illustrates the definition of the surface roughness of the roughened surface, in accordance with some embodiments.

FIG. 1B is a schematic cross-sectional view of the roughened surface 125 of the first capping layer 124 according to various embodiments of the present disclosure, and illustrates the definition of the surface roughness (Rz) of the roughened surface 125. As illustrated in FIG. 1B, the first capping layer 124 disposed on the dielectric layer 122 has, for example, the roughened surface 125, and the surface roughness (Rz) of the roughened surface 125 is substantially in a range of $4E^{-6}$-$3.3E^{-5}$ μm.

The surface roughness (Rz) of the roughened surface 125 on the first capping layer 124 is sampled from the roughness profile of the roughened surface 125 in the direction of the mean line (132, the average thickness of roughened surface 125 on the first capping layer 124), the distance between the top profile peak line 134 and the bottom profile valley line 136 on this sampled portion is measured in the longitudinal magnification direction of roughness profile. The value of the surface roughness (Rz) is generally expressed in micrometer (μm).

In various embodiments, the roughness average, skewness, or other properties may be determined by a profilometer that passes a needle over the exposed surface and generates a trace of the fluctuations of the height of the asperities on the roughened surface 125 of the first capping layer 124, or by a scanning electron microscope that uses an electron beam reflected from the roughened surface 125 of the first capping layer 124 to generate an image of the roughened surface 125.

Figure 2:
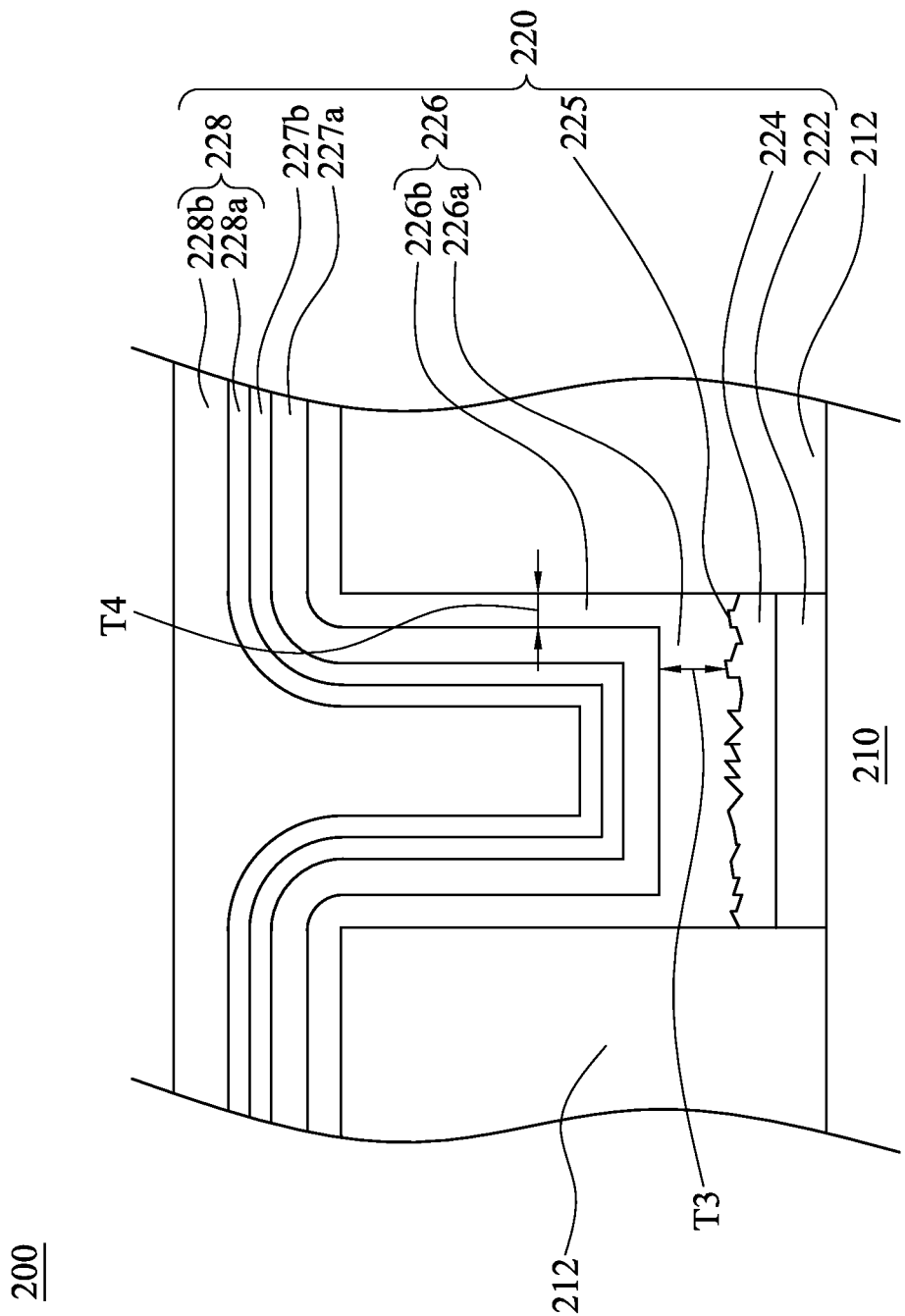
FIG. 2 is a schematic cross-sectional view of a semiconductor device, in accordance with some embodiments.

FIG. 2 is a schematic cross-sectional view of a semiconductor device 200 according to various embodiments of the present disclosure. The semiconductor device 200 includes a substrate 210 and a plurality of gate stacks 220, and one of the gate stacks 220 is enlarged showing in detail in FIG. 2.

The substrate 210 includes a plurality of spacer pairs 212. In various embodiments of the present disclosure, the substrate 210 is a semiconductor substrate. The gate stacks 220 are disposed on the substrate 210, and individually disposed between the spacer pairs 212. Each one of the gate stacks 220 includes a dielectric layer 222, a first capping layer 224, a second capping layer 226, a third capping layer 227a, a fourth capping layer 227b, and a gate electrode layer 228.

The dielectric layer 222 is disposed on the substrate 210. In various embodiments of the present disclosure, the dielectric layer 222 is made from a high-k dielectric material including hafnium oxide (HfO$_2$), tantalum oxide (Ta$_2$O$_5$), zirconium oxide (ZrO$_2$) or aluminum oxide (Al$_2$O$_3$). The first capping layer 124 is disposed on the dielectric layer 122, and has a roughened surface 125. In various embodiments of the present disclosure, the first capping layer 224 is a first nitride layer such as a titanium nitride layer. The roughened surface 225 of the first capping layer 224 is by performing a wet-etching process in various embodiments of the present disclosure.

The second capping layer 226 has a bottom portion 226a and a sidewall portion 226b. The bottom portion 226a of the second capping layer 226 is disposed on the roughened surface 225 of the first capping layer 224, and the sidewall portion 226b of the second capping layer 226 is peripherally enclosed by the spacer pairs 212. In various embodiments of the present disclosure, the second capping layer 226 is a second nitride layer such as a tantalum nitride layer. In various embodiments of the present disclosure, the thickness of the bottom portion 226a is greater than the thickness of the sidewall portion 226b. In various embodiments of the present disclosure, the ratio of the thickness of the sidewall portion 226b to the thickness of the bottom portion 226a is in a range of 0.5 to 1.

Different from the semiconductor device 100 in FIG. 1A, the semiconductor device 200 further includes the third capping layer 227a and the fourth capping layer 227b, and the gate electrode layer 228 is a multi-layer.

The third capping layer 227a is disposed on the second capping layer 226, and the fourth capping layer 227b is disposed on the third capping layer 227a. In various embodiments of the present disclosure, the third capping layer 227a is a third nitride layer such as a titanium nitride layer. In various embodiments of the present disclosure, the fourth capping layer 227b is a fourth nitride layer such as a tantalum nitride layer.

The multi-layer covers the fourth capping layer 227b. In various embodiments of the present disclosure, the multi-layer includes an alloy layer 228a disposed on the fourth capping layer 227b and a metal layer 228b disposed on the alloy layer 228a. In various embodiments of the present disclosure, the material of the alloy layer 228a, the metal layer 228b or both is one selected from the group consisting of tungsten (W), copper (Cu), titanium (Ti), silver (Ag), aluminum (Al), titanium aluminide (TiAl), titanium aluminum nitride (TiAlN), tantalum carbide (TaC), tantalum cyanide (TaCN), tantalum silicon nitride (TaSiN), manganese (Mn), zirconium (Zr) and the combination thereof.

FIGS. 3A-3E are schematic cross-sectional views at various stages of fabricating a semiconductor device 300 according to various embodiments of the present disclosure. The method is able to locally repair all types of aforementioned issues, so as to enhance the dielectric property of the gate stack in the semiconductor device according to various embodiments of the present disclosure.

In FIG. 3A, a gate stack 320 and a spacer pair 312 are formed on a substrate 310. The spacer pair 312 is formed on sidewalls of the gate stack 320. The gate stack 320 is sequentially formed of a dielectric layer 322, a first capping layer 324 and a polysilicon layer 326.

The dielectric layer 322 is formed on the substrate 310. In various embodiments of the present disclosure, the dielectric layer 322 is formed of a high-k dielectric material including hafnium oxide ($HfO_2$), tantalum oxide ($Ta_2O_5$), zirconium oxide ($ZrO_2$) or aluminum oxide ($Al_2O_3$). In various embodiments of the present disclosure, the dielectric layer 322 is by performing physical vapor deposition (PVD), chemical vapor deposition (CVD), atomic layer deposition (ALD) or plasma-enhanced chemical vapor deposition (PECVD).

The first capping layer 324 is formed on the dielectric layer 322. In various embodiments of the present disclosure, the first capping layer 324 is formed of a first metal nitride material including titanium nitride. In various embodiments of the present disclosure, the first capping layer 324 is by performing physical vapor deposition (PVD), chemical vapor deposition (CVD), atomic layer deposition (ALD) or plasma-enhanced chemical vapor deposition (PECVD).

The polysilicon layer 326 is formed on the first capping layer 324. In various embodiments of the present disclosure, the polysilicon layer 326 is by performing physical vapor deposition (PVD), chemical vapor deposition (CVD), atomic layer deposition (ALD) or plasma-enhanced chemical vapor deposition (PECVD).

Figure 3B:
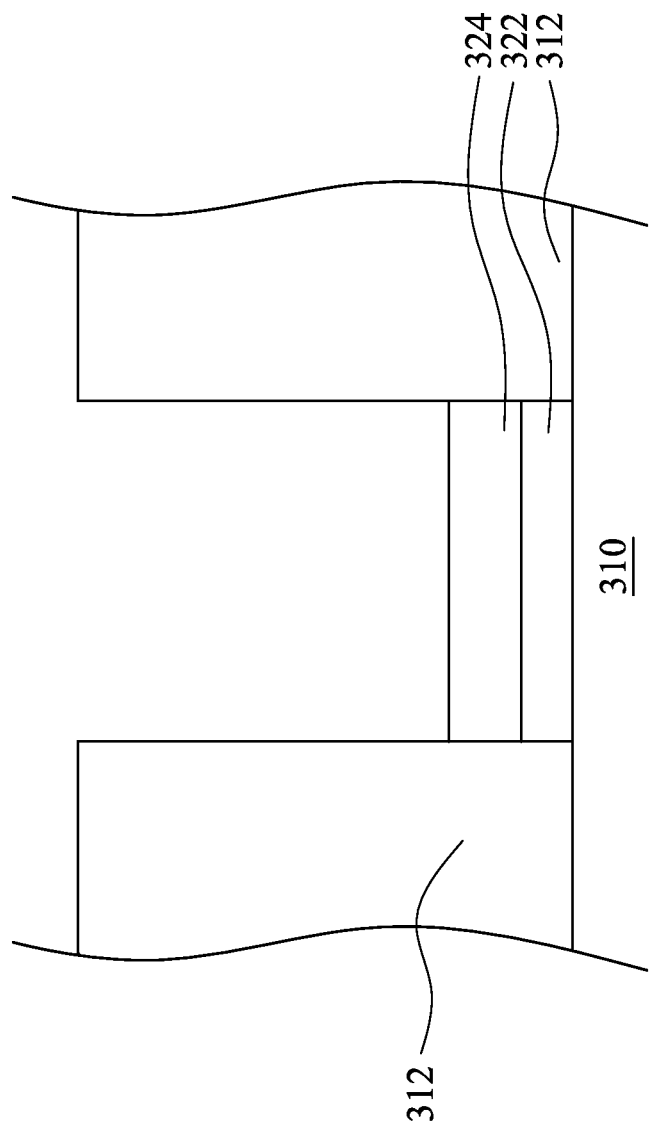

Referring to FIG. 3B, the polysilicon layer 326 of the gate stack 320 is removed, so as to expose the first capping layer 324. In various embodiments of the present disclosure, the polysilicon layer 326 is removed by a wet-etching process. In various embodiments of the present disclosure, an oxidizing solution used in the wet-etching process includes an etching solution and an oxidant. In various embodiments of the present disclosure, the etching solution includes hydrogen fluoride (HF), and the oxidant includes deionized water (DIW), sodium hydroxide (NaOH) or potassium hydroxide (KOH).

Figure 3C:
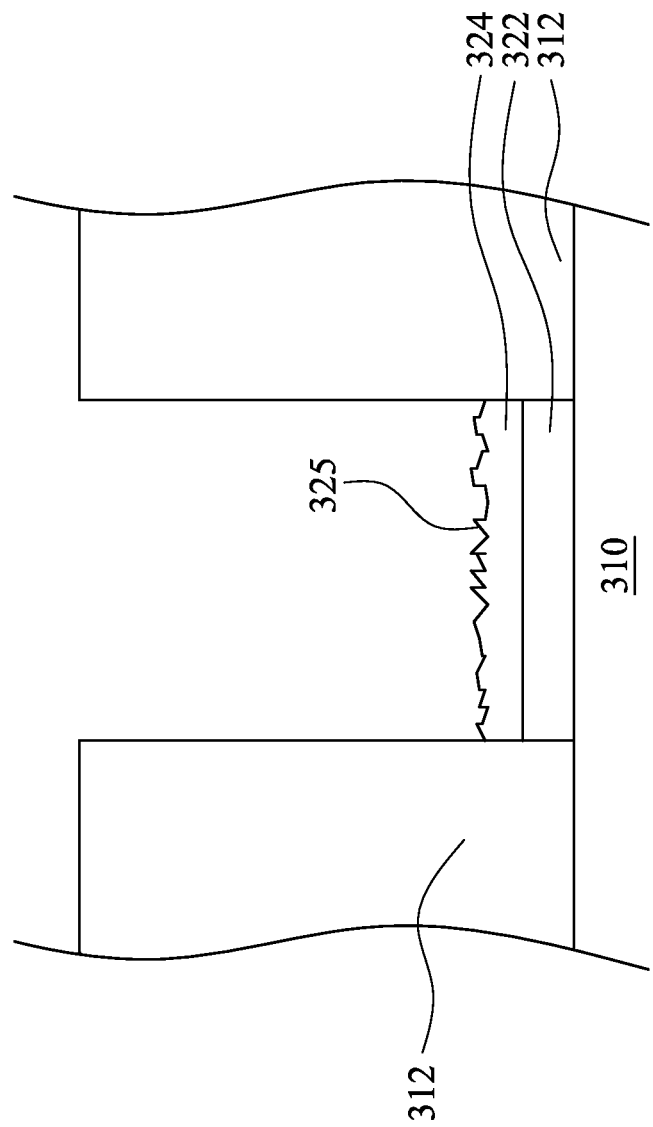

In FIG. 3C, the exposed surface of the first capping layer 324 is etched by the etching solution to form a roughened surface 325 on the first capping layer 324. In various embodiments of the present disclosure, the first capping layer 324 is formed of titanium nitride (TiN). The nature of titanium nitride may be oxidized by the oxidant of the etching solution. For example, TiN may react with DIW to generate titanium dioxide ($TiO_2$). The oxidation of titanium nitride is shown in Scheme 1:

Scheme 1

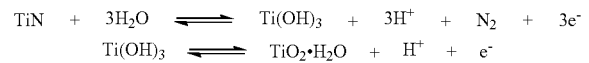

$TiO_2$ may further react with HF in the etching solution to generate titanium hexafluoride anion ($TiF_6^{2-}$), and then $TiF_6^{2-}$ may solute in the etching solution to be removed, so that the first capping layer 324 may form the roughened surface 325. In various embodiments of the present disclosure, the roughened surface 325 of the first capping layer 324 is formed to have a surface roughness (Rz) in a range of $4E^{-6}$-$3.3E^{-5}$ μm. The reaction scheme of $TiO_2$ and HF is shown in Scheme 2:

Scheme 2

-continued

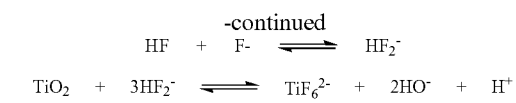

After the operation of forming the roughened surface 325 of the first capping layer 324, the roughened surface 325 may be formed of $Ti(OH)_3$, $TiO_2$ and TiN, so that the roughened surface 325 of the first capping layer 324 is forming a plurality of hydroxyl (–OH) groups on the roughened surface 325, according to some embodiments of the present disclosure.

When hydroxyl groups are formed on the roughened surface 325 of the first capping layer 324, the hydroxyl groups may catch more ammonia ($NH_3$) on the first capping layer 324, and then pentakis-dimethylamino tantalum (PDMAT) is added to form a tantalum nitride layer as the second capping layer 327.

Figure 3D:
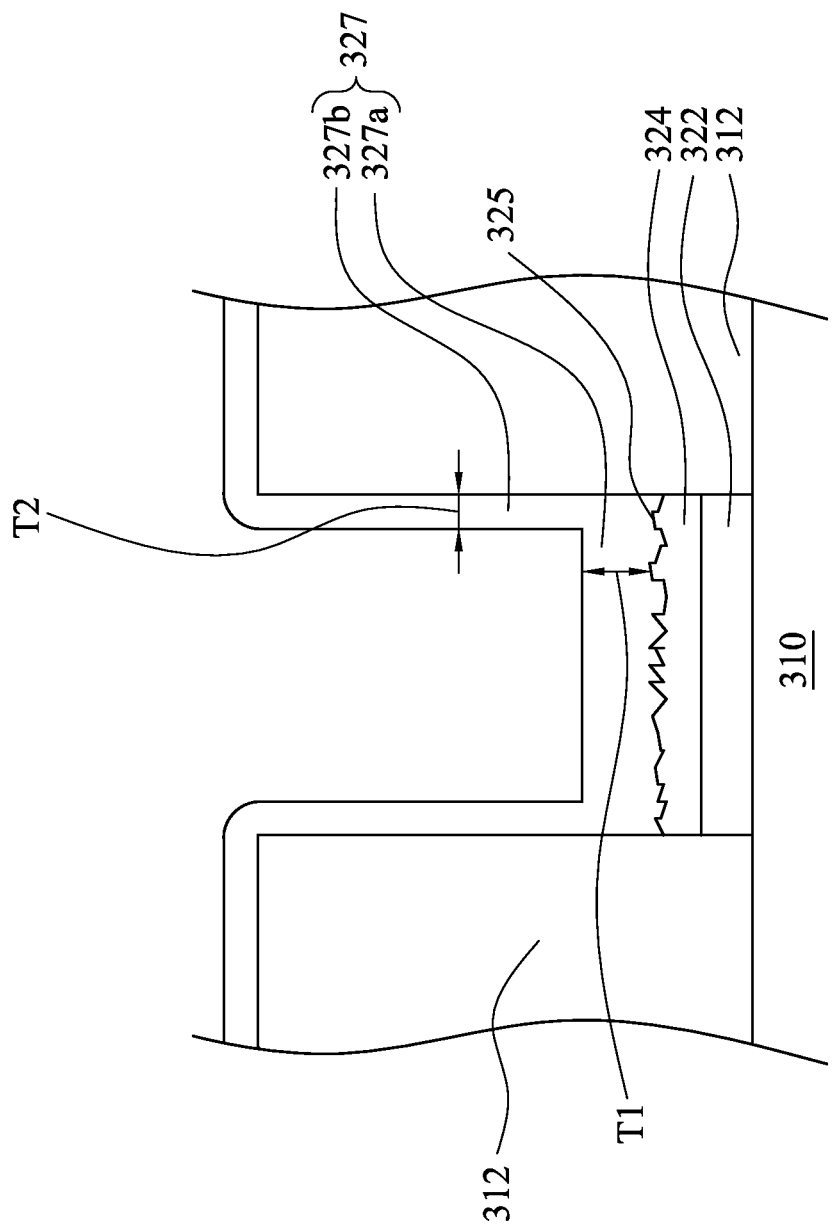

Referring to FIG. 3D, the second capping layer 327 is formed on the roughened surface 325 of the first capping layer 324 and the spacer pair 312. The second capping layer 327 is formed to have a bottom portion 327a and a sidewall portion 327b. In various embodiments of the present disclosure, the thickness (T1) of the bottom portion 327a is formed to be greater than the thickness (T2) of the sidewall portion 327b. In various embodiments of the present disclosure, the ratio of T2 to T1 is in a range of 0.5 to 1.

In various embodiments of the present disclosure, the second capping layer 327 is formed of a second metal nitride material including tantalum nitride. In various embodiments of the present disclosure, the second capping layer 327 is by performing physical vapor deposition (PVD), chemical vapor deposition (CVD), atomic layer deposition (ALD) or plasma-enhanced chemical vapor deposition (PECVD).

Figure 3E:
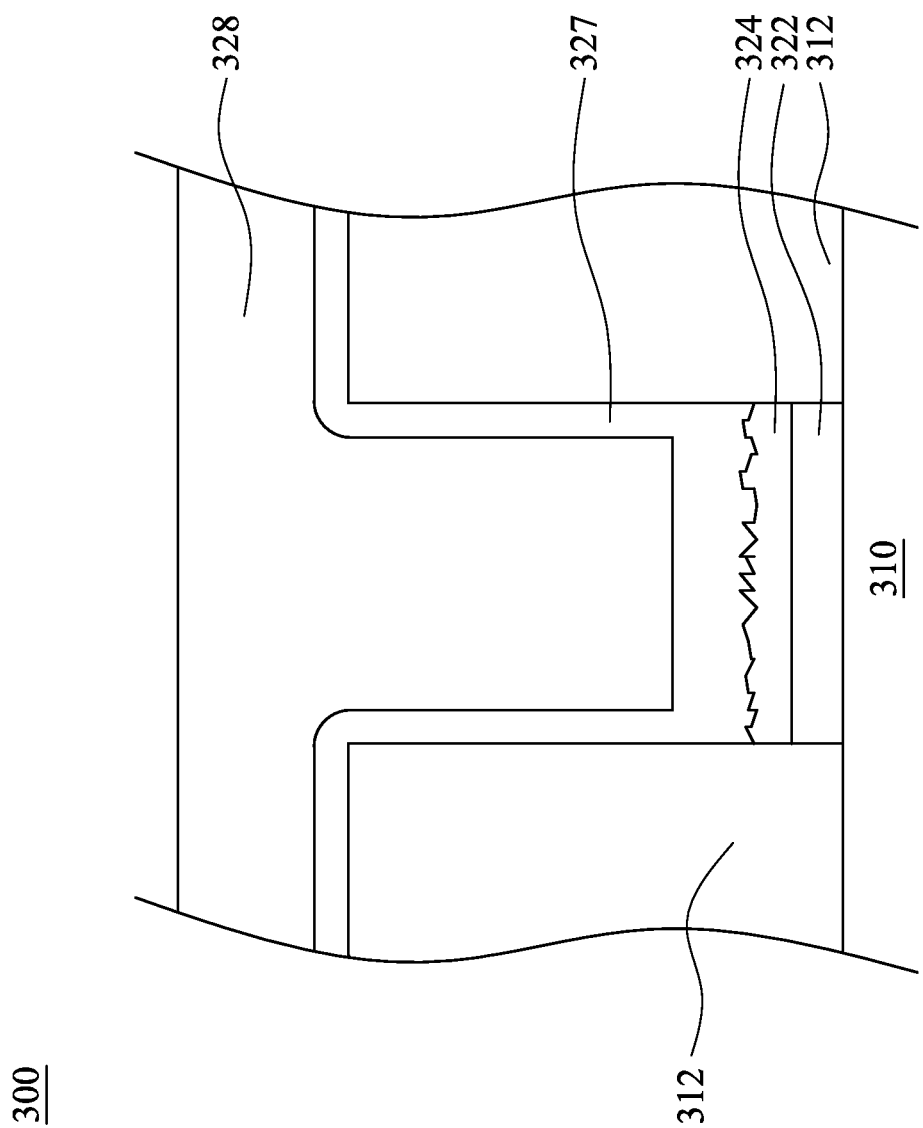

In FIG. 3E, the gate electrode layer 328 is formed on the second capping layer 327. In various embodiments of the present disclosure, the gate electrode layer 328 is formed of tungsten (W), copper (Cu), titanium (Ti), silver (Ag), aluminum (Al), titanium aluminide (TiAl), titanium aluminum nitride (TiAlN), tantalum carbide (TaC), tantalum cyanide (TaCN), tantalum silicon nitride (TaSiN), manganese (Mn), zirconium (Zr) or the combination thereof. In various embodiments of the present disclosure, the gate electrode layer 328 is by performing a sputtering process, a plating process, an evaporation process, physical vapor deposition (PVD), chemical vapor deposition (CVD), atomic layer deposition (ALD) or plasma-enhanced chemical vapor deposition (PECVD).

Figure 4:
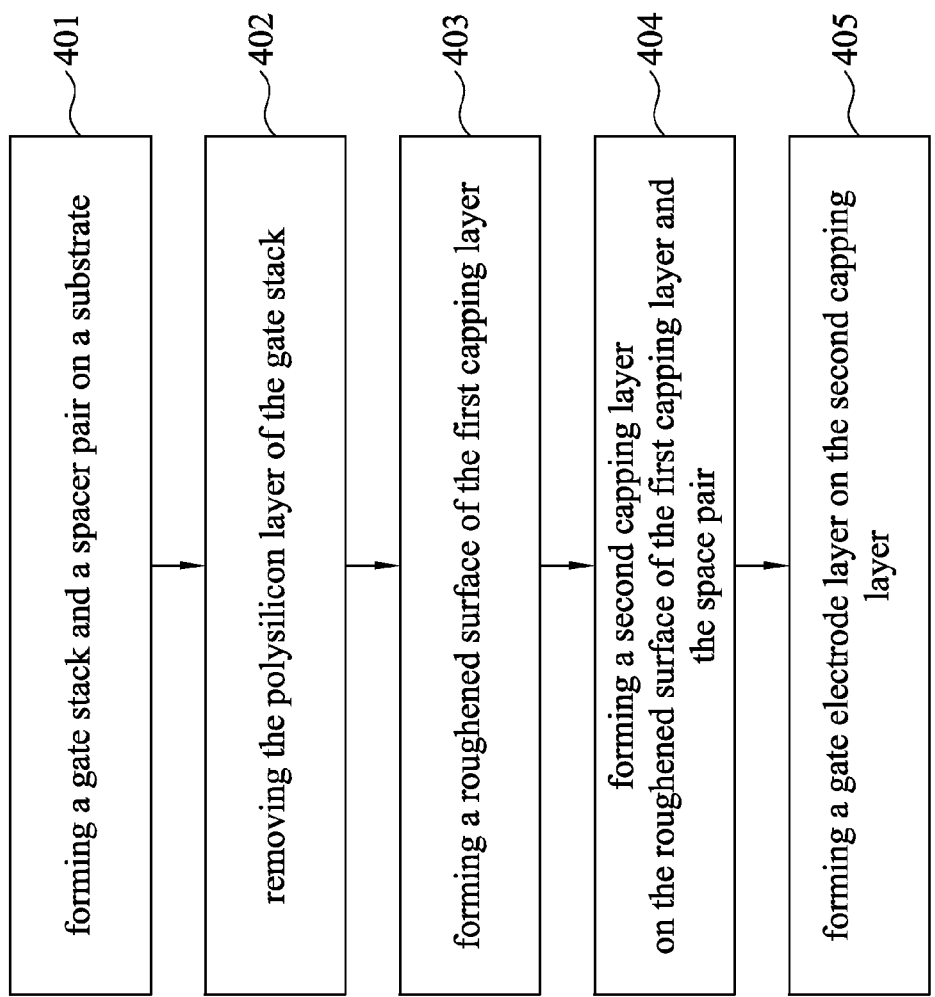
FIG. 4 is a flow chart illustrating a method of manufacturing a semiconductor device, in accordance with some embodiments.

FIG. 4 is a flow chart illustrating a method of manufacturing a semiconductor device according to various embodiments of the present disclosure. The operations 401 to 405 are disclosed in association with the cross-sectional views of the semiconductor device 300 from FIGS. 3A to 3E at various fabrication stages.

In the operation 401, the gate stack 320 and the spacer pair 312 are formed on the substrate 310. Referring to FIG. 3A, the spacer pair 312 is formed on sidewalls of the gate stack 320, and the gate stack 320 is sequentially formed of the dielectric layer 322, the first capping layer 324 and the polysilicon layer 326. In various embodiments of the present disclosure, the first capping layer 324 is formed of a first metal nitride material including titanium nitride. In various embodiments of the present disclosure, the first capping layer 324 is by performing physical vapor deposition (PVD), chemical vapor deposition (CVD), atomic layer deposition (ALD) or plasma-enhanced chemical vapor deposition (PECVD).

Still referring to the operation 402, the polysilicon layer 326 of the gate stack 320 is removed. In various embodiments of the present disclosure, the polysilicon layer 326 is removed by a wet-etching process. In various embodiments of the present disclosure, an oxidizing solution used in the wet-etching process includes an etching solution and an oxidant. In various embodiments of the present disclosure, the etching solution includes hydrogen fluoride (HF), and the oxidant includes deionized water (DIW), sodium hydroxide (NaOH) or potassium hydroxide (KOH).

In the operation 403, the roughened surface 325 of the first capping layer 324 is formed by performing a wet-etching process. In various embodiments of the present disclosure, an oxidizing solution used in the wet-etching process includes an etching solution and an oxidant. In various embodiments of the present disclosure, the etching solution includes hydrogen fluoride (HF), and the oxidant includes deionized water (DIW), sodium hydroxide (NaOH) or potassium hydroxide (KOH). In various embodiments of the present disclosure, the roughened surface 325 of the first capping layer 324 is forming a plurality of hydroxyl (–OH) groups on the roughened surface 325.

Referring to the operation 404, the second capping layer 327 is formed on the roughened surface 325 of the first capping layer 324 and the space pair 312. In FIG. 3D, the second capping layer 327 is formed to have a bottom portion 327a and a sidewall portion 327b, and the thickness (T1) of the bottom portion 327a is formed to be greater than the thickness (T2) of the sidewall portion 327b. In various embodiments of the present disclosure, the ratio of T2 to T1 is in a range of 0.5 to 1. In various embodiments of the present disclosure, the second capping layer 327 is formed of a second metal nitride material including tantalum nitride. In various embodiments of the present disclosure, the second capping layer 327 is by performing physical vapor deposition (PVD), chemical vapor deposition (CVD), atomic layer deposition (ALD) or plasma-enhanced chemical vapor deposition (PECVD).

In the operation 405, the gate electrode layer 328 is formed on the second capping layer 327. In various embodiments of the present disclosure, the gate electrode layer 328 is by performing a sputtering process, a plating process, an evaporation process, physical vapor deposition (PVD), chemical vapor deposition (CVD), atomic layer deposition (ALD) or plasma-enhanced chemical vapor deposition (PECVD).

FIGS. 5A-5H are schematic cross-sectional views at various stages of fabricating a semiconductor device 500 according to various embodiments of the present disclosure. The method is able to locally repair all types of aforementioned issues, so as to enhance the dielectric property of the gate stack in the semiconductor device according to various embodiments of the present disclosure.

Figure 5A:
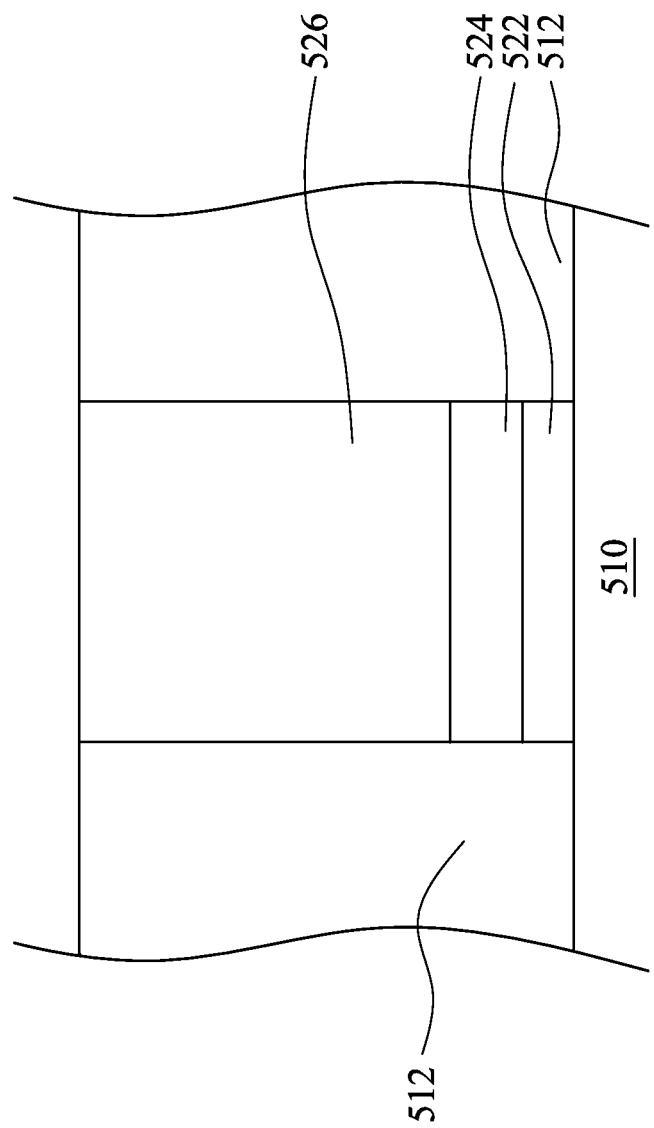
FIGS. 5A-5H are schematic cross-sectional views at various stages of fabricating a semiconductor device, in accordance with some embodiments.

In FIG. 5A, a gate stack 520 and a spacer pair 512 are formed on a substrate 510. The spacer pair 512 is formed on sidewalls of the gate stack 520. The gate stack 520 is sequentially formed of a dielectric layer 522, a first nitride layer 524 and a polysilicon layer 526.

The dielectric layer 522 is formed on the substrate 510. In various embodiments of the present disclosure, the dielectric layer 522 is formed of a high-k dielectric material including hafnium oxide ($HfO_2$), tantalum oxide ($Ta_2O_5$), zirconium oxide ($ZrO_2$) or aluminum oxide ($Al_2O_3$). In various embodiments of the present disclosure, the dielectric layer 522 is by performing physical vapor deposition (PVD), chemical vapor deposition (CVD), atomic layer deposition (ALD) or plasma-enhanced chemical vapor deposition (PECVD).

The first nitride layer 524 is formed on the dielectric layer 522. In various embodiments of the present disclosure, the first nitride layer 524 is formed of titanium nitride. In various embodiments of the present disclosure, the first nitride layer 524 is by performing physical vapor deposition (PVD), chemical vapor deposition (CVD), atomic layer deposition (ALD) or plasma-enhanced chemical vapor deposition (PECVD).

The polysilicon layer 526 is formed on the first nitride layer 524. In various embodiments of the present disclosure, the polysilicon layer 526 is by performing physical vapor deposition (PVD), chemical vapor deposition (CVD), atomic layer deposition (ALD) or plasma-enhanced chemical vapor deposition (PECVD).

Figure 5B:
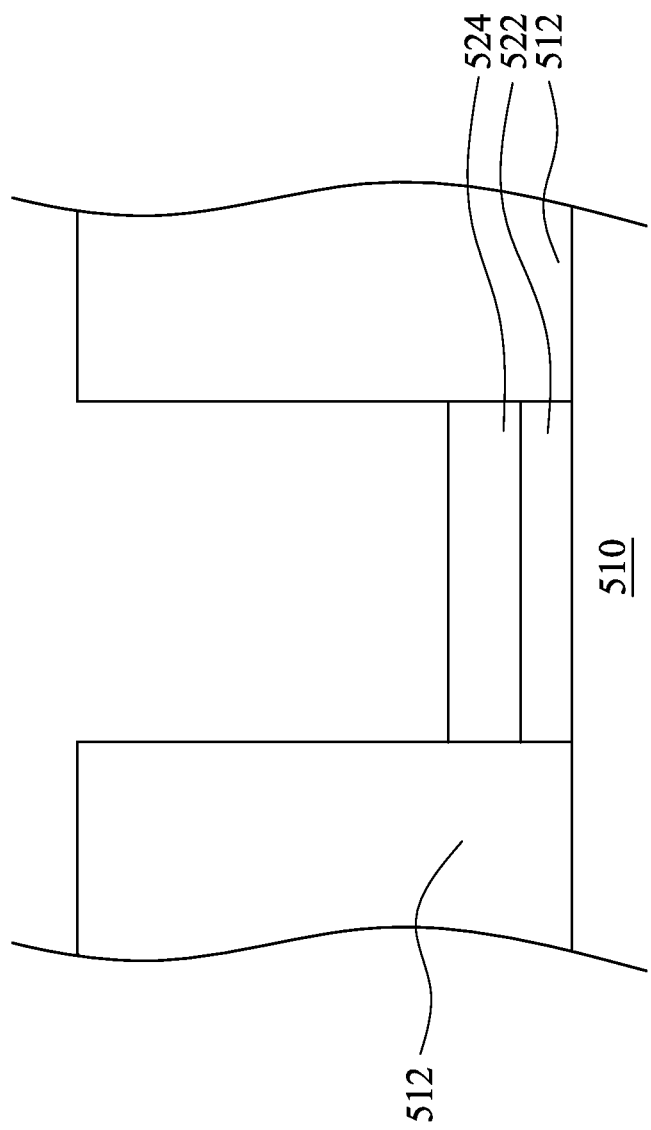

Referring to FIG. 5B, the polysilicon layer 526 of the gate stack 520 is removed, so as to expose the first nitride layer 524. In various embodiments of the present disclosure, the polysilicon layer 526 is removed by a wet-etching process. In various embodiments of the present disclosure, an oxidizing solution used in the wet-etching process includes an etching solution and an oxidant. In various embodiments of the present disclosure, the etching solution includes hydrogen fluoride (HF), and the oxidant includes deionized water (DIW), sodium hydroxide (NaOH) or potassium hydroxide (KOH).

Figure 5C:
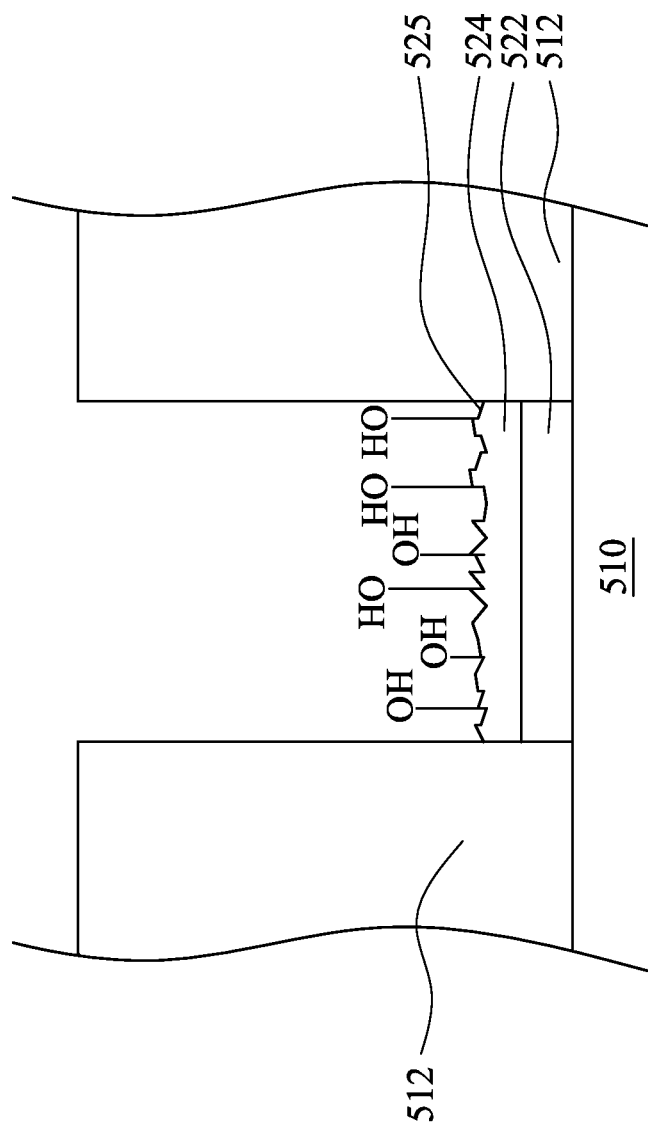

In FIG. 5C, the exposed surface of the first nitride layer 524 is etched by performing a wet-etching process and an oxidation of the first nitride layer 524 by an etching solution and an oxidant to form a roughened surface 525 of the first nitride layer 524. In various embodiments of the present disclosure, the first nitride layer 524 is formed of titanium nitride (TiN). The nature of titanium nitride may be oxidized by the oxidant of the etching solution. For example, TiN may react with DIW to generate titanium dioxide ($TiO_2$), and then $TiO_2$ may further react with HF in the etching solution to generate titanium hexafluoride anion ($TiF_6^{2-}$), and then $TiF_6^{2-}$ may solute in the etching solution to be removed, so that the first nitride layer 524 may form the roughened surface 525. In various embodiments of the present disclosure, the roughened surface 525 of the first nitride layer 524 is formed to have a surface roughness (Rz) in a range of $4E^{-6}$-$3.3E^{-5}$ μm.

After the operation of forming the roughened surface 525 of the first nitride layer 524, the roughened surface 525 may be formed of $Ti(OH)_3$, $TiO_2$ and TiN, so that the roughened surface 525 of the first nitride layer 524 is forming a plurality of hydroxyl (—OH) groups on the roughened surface 525. When hydroxyl groups are formed on the roughened surface 525 of the first nitride layer 524, the hydroxyl groups may catch more ammonia ($NH_3$) on the first nitride layer 524, and then pentakis-dimethylamino tantalum (PDMAT) is added to form a tantalum nitride layer as a second nitride layer 527.

Figure 5D:
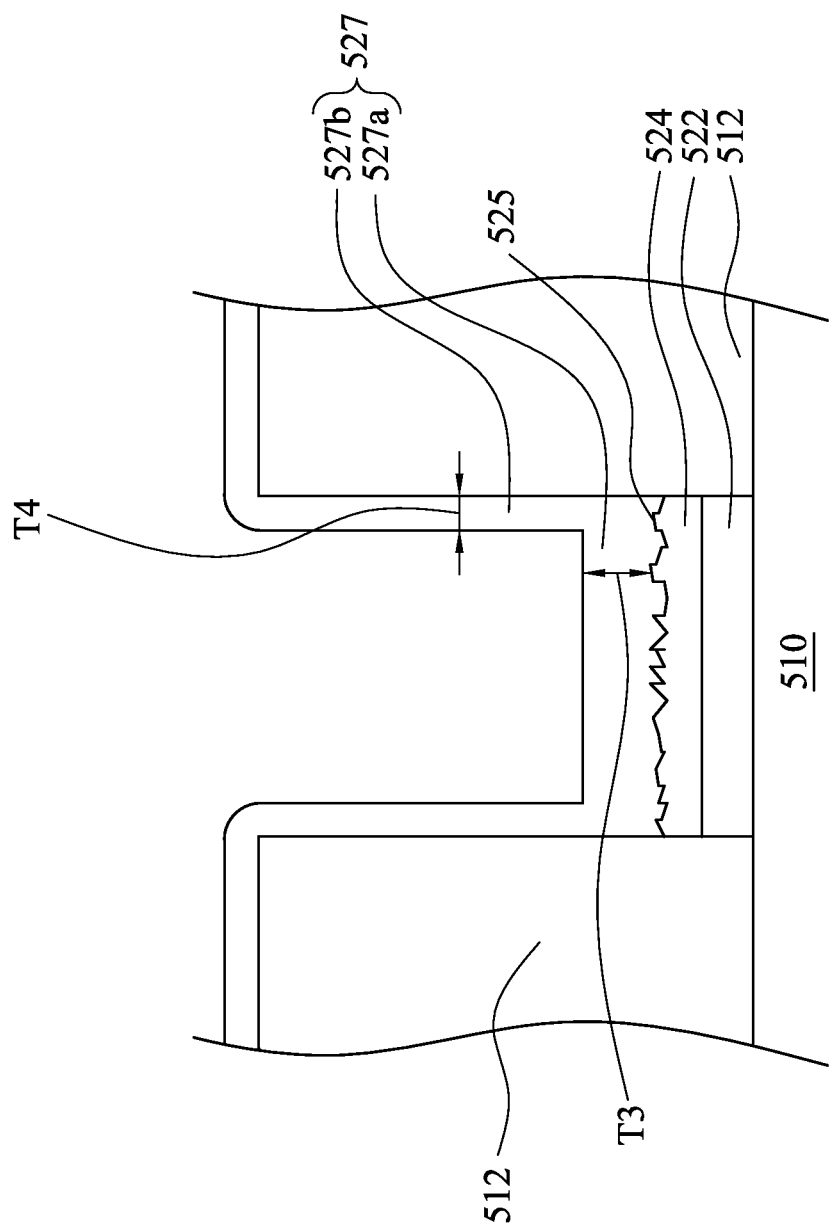

Referring to FIG. 5D, the second nitride layer 527 is formed on the roughened surface 525 of the first nitride layer 524 and the spacer pair 512. The second nitride layer 527 is formed to have a bottom portion 527a and a sidewall portion 527b. In various embodiments of the present disclosure, the thickness (T1) of the bottom portion 527a is formed to be greater than the thickness (T2) of the sidewall portion 527b. In various embodiments of the present disclosure, the ratio of T2 to T1 is in a range of 0.5 to 1.

In various embodiments of the present disclosure, the second nitride layer 527 is formed of tantalum nitride. In various embodiments of the present disclosure, the second nitride layer 527 is by performing physical vapor deposition (PVD), chemical vapor deposition (CVD), atomic layer deposition (ALD) or plasma-enhanced chemical vapor deposition (PECVD).

Different from the stages of fabricating the semiconductor device 300 in FIGS. 3A-3E, the stages of fabricating the semiconductor device 500 further includes forming a third nitride layer 528a and forming a fourth nitride layer 528b, and the gate electrode layer 529 is formed as a multi-layer.

Figure 5E:
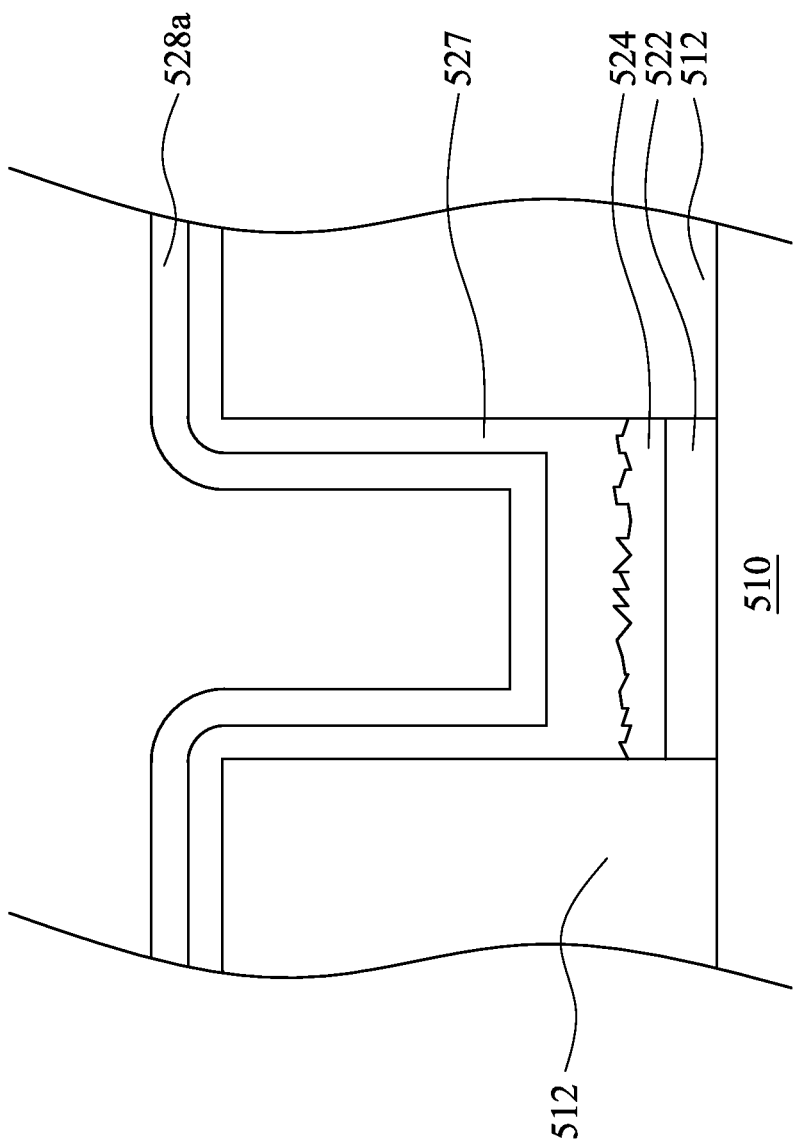

In FIG. 5E, a third nitride layer 528a is formed on the second nitride layer 527. In various embodiments of the present disclosure, the third nitride layer 528a is formed of titanium nitride. In various embodiments of the present disclosure, the third nitride layer 528a is by performing physical vapor deposition (PVD), chemical vapor deposition (CVD), atomic layer deposition (ALD) or plasma-enhanced chemical vapor deposition (PECVD).

Figure 5F:
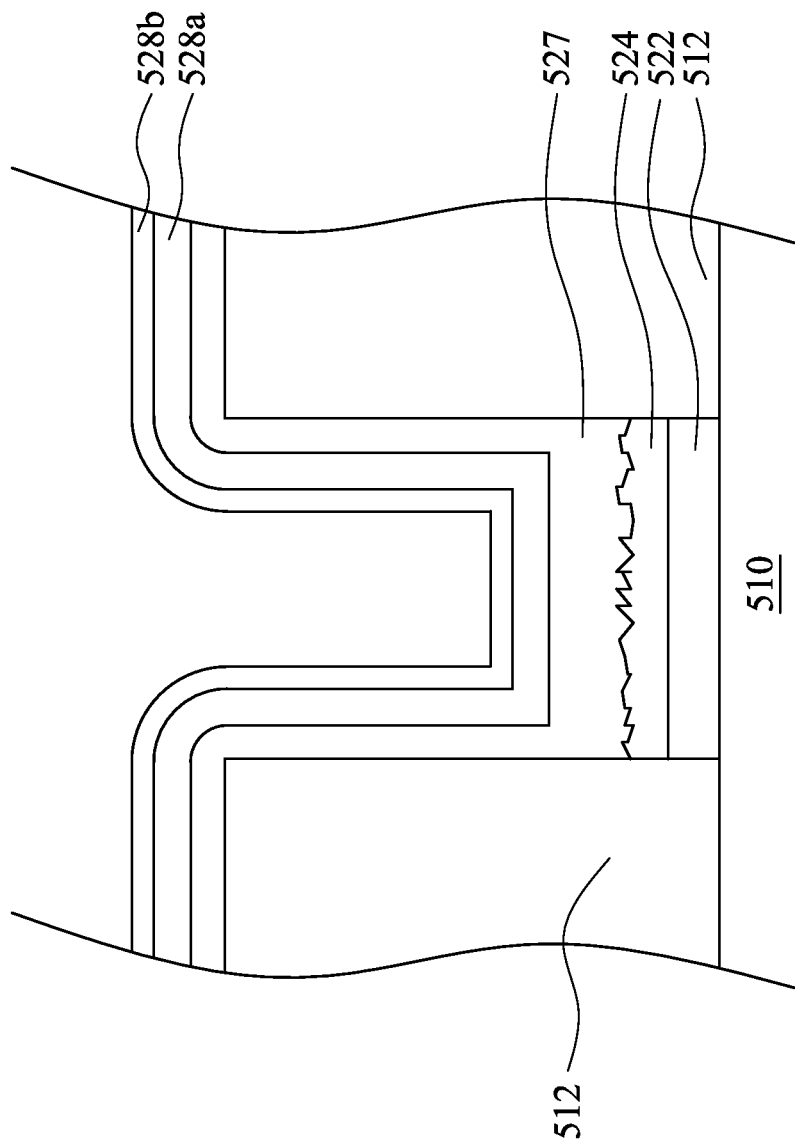

Referring to FIG. 5F, a fourth nitride layer 528b is formed on the third nitride layer 528a. In various embodiments of the present disclosure, the fourth nitride layer 528b is formed of titanium nitride. In various embodiments of the present disclosure, the fourth nitride layer 528b is by performing physical vapor deposition (PVD), chemical vapor deposition (CVD), atomic layer deposition (ALD) or plasma-enhanced chemical vapor deposition (PECVD).

Figure 5G:
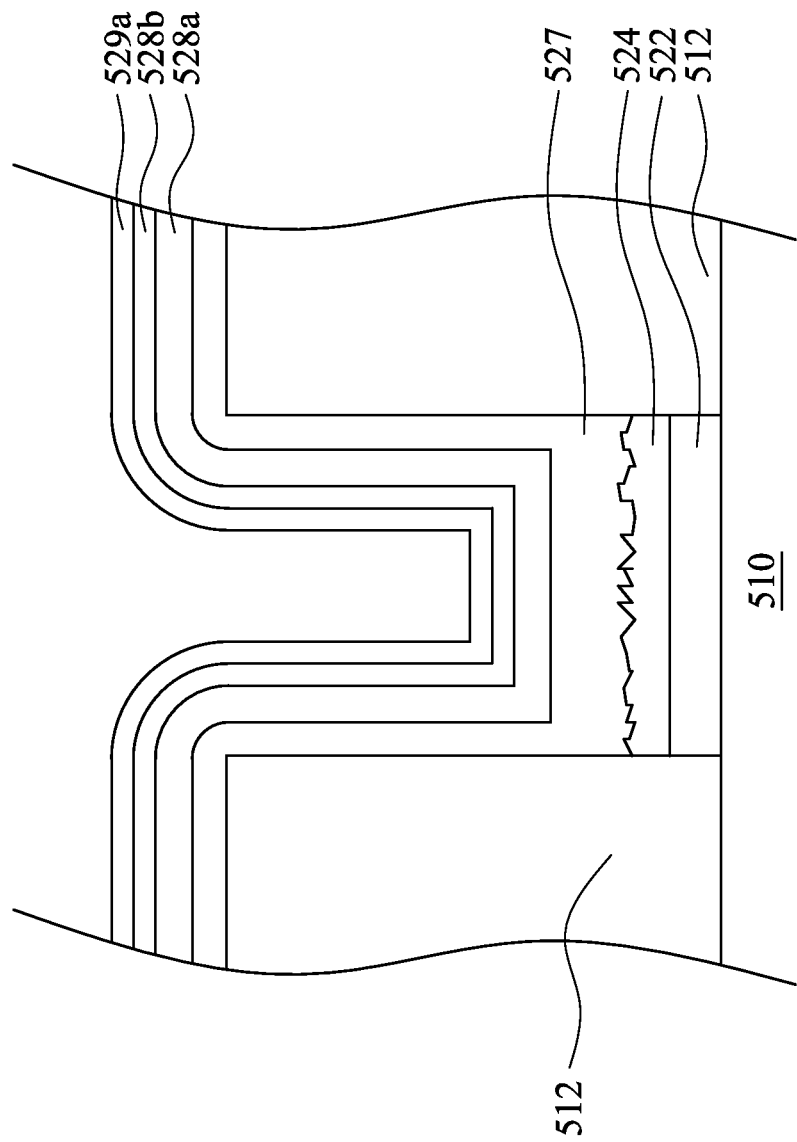
Figure 5H:
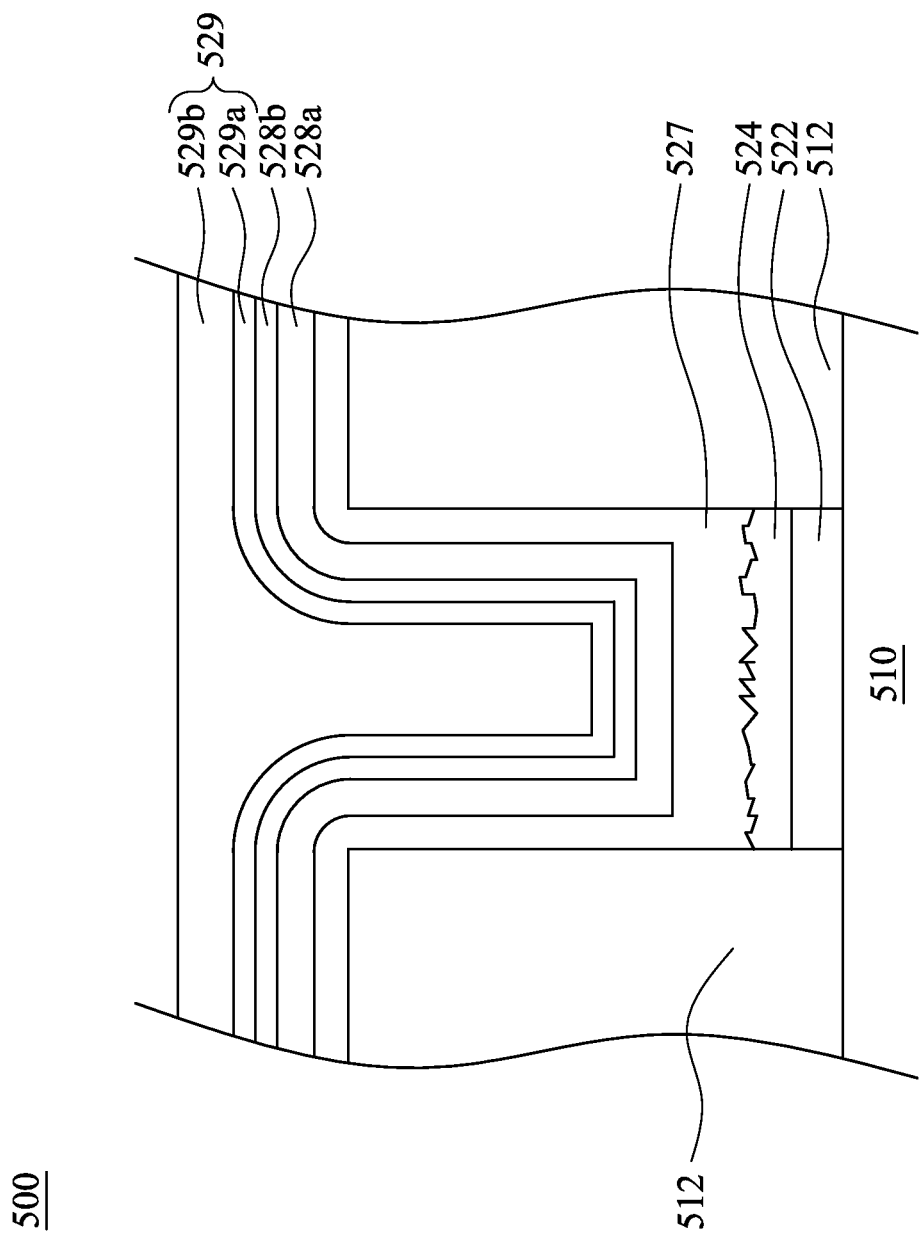

In FIGS. 5G and 5H, the gate electrode layer 529 is formed on the fourth nitride layer 528b. The gate electrode layer 529 is formed of an alloy layer 529a and a metal layer 529b. Referring to FIG. 5G, the alloy layer 529a is formed on the fourth nitride layer 528b. Still referring to FIG. 5H, the metal layer 529b is formed on the alloy layer 529a.

In various embodiments of the present disclosure, the alloy layer 529a is formed of titanium aluminide (TiAl), titanium aluminum nitride (TiAlN), tantalum carbide (TaC), tantalum cyanide (TaCN), tantalum silicon nitride (TaSiN) or the combination thereof. In various embodiments of the present disclosure, the metal layer 529b is formed of tungsten (W), copper (Cu), titanium (Ti), silver (Ag), aluminum (Al), manganese (Mn), zirconium (Zr) or the combination thereof. In various embodiments of the present disclosure, the alloy layer 529a and the metal layer 529b are by performing a sputtering process, a plating process, an evaporation process, physical vapor deposition (PVD), chemical vapor deposition (CVD), atomic layer deposition (ALD) or plasma-enhanced chemical vapor deposition (PECVD).

Figure 6:
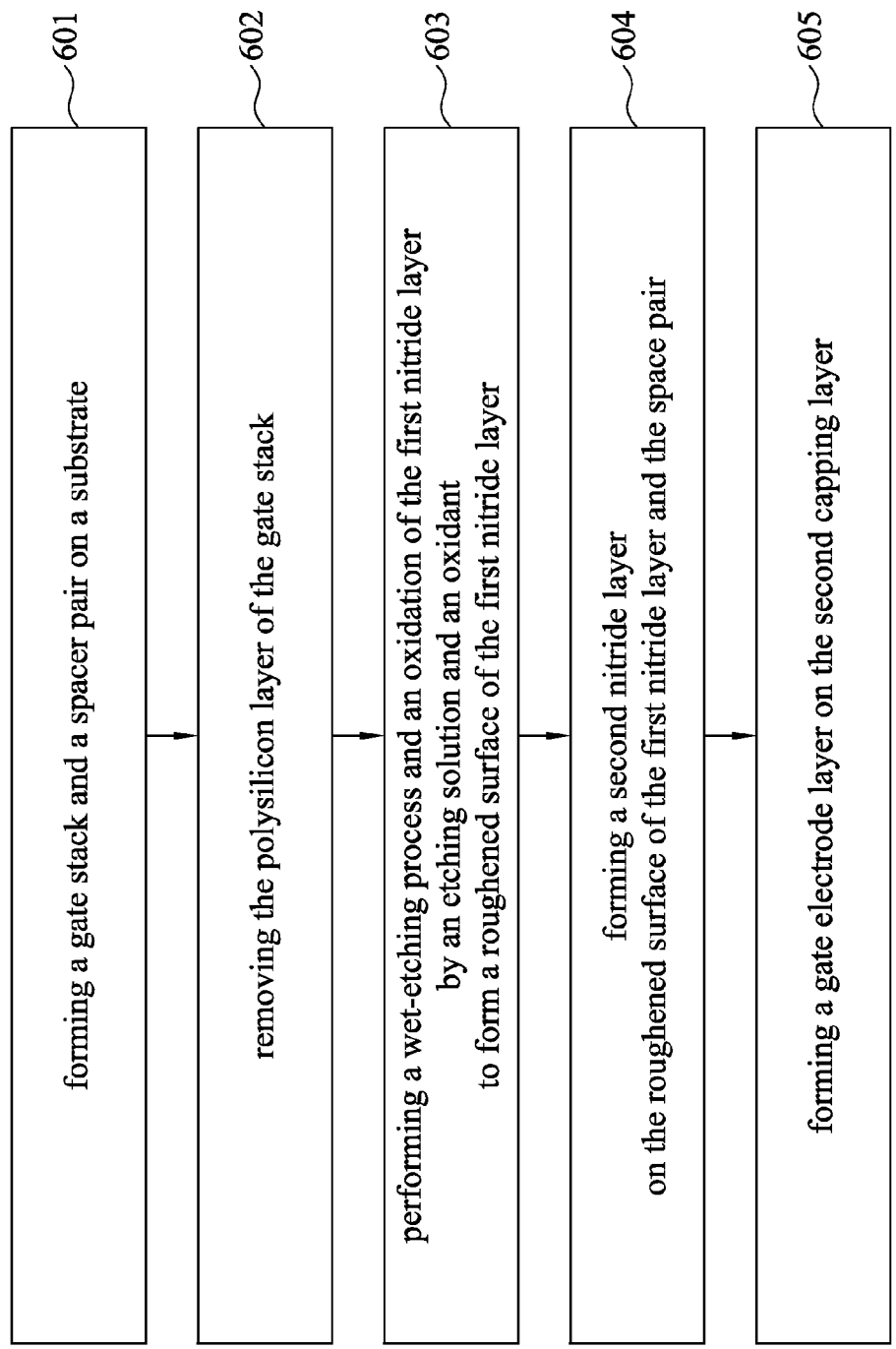
FIG. 6 is a flow chart illustrating a method of manufacturing a semiconductor device, in accordance with some embodiments.

FIG. 6 is a flow chart illustrating a method of manufacturing a semiconductor device according to various embodiments of the present disclosure. The operations 601 to 605 are disclosed in association with the cross-sectional views of the semiconductor device 500 from FIGS. 5A to 5H at various fabrication stages.

In the operation 601, the gate stack 520 and the spacer pair 512 are formed on the substrate 510. Referring to FIG. 5A, the spacer pair 512 is formed on sidewalls of the gate stack 520, and the gate stack 520 is sequentially formed of the dielectric layer 522, the first nitride layer 524 and the polysilicon layer 526. In various embodiments of the present disclosure, the first nitride layer 524 is formed of a first metal nitride material including titanium nitride. In various embodiments of the present disclosure, the first nitride layer 524 is by performing physical vapor deposition (PVD), chemical vapor deposition (CVD), atomic layer deposition (ALD) or plasma-enhanced chemical vapor deposition (PECVD).

Still referring to the operation 602, the polysilicon layer 526 of the gate stack 520 is removed. In various embodiments of the present disclosure, the polysilicon layer 526 is removed by a wet-etching process. In various embodiments of the present disclosure, an oxidizing solution used in the wet-etching process includes an etching solution and an oxidant. In various embodiments of the present disclosure, the etching solution includes hydrogen fluoride (HF), and the oxidant includes deionized water (DIW), sodium hydroxide (NaOH) or potassium hydroxide (KOH).

In the operation 603, the wet-etching process and the oxidation of the first nitride layer 524 is performed by the etching solution and the oxidant to form the roughened surface 525 of the first nitride layer 524. Referring to FIG. 5C, the roughened surface 525 of the first nitride layer 524 is forming a plurality of hydroxyl (—OH) groups on the roughened surface 525. In various embodiments of the present disclosure, the etching solution includes hydrogen fluoride (HF), and the oxidant includes deionized water (DIW), sodium hydroxide (NaOH) or potassium hydroxide (KOH).

Referring to the operation 604, the second nitride layer 527 is formed on the roughened surface 525 of the first nitride layer 524 and the space pair 512. In FIG. 5D, the second nitride layer 527 is formed to have a bottom portion 527a and a sidewall portion 527b, and the thickness (T1) of the bottom portion 527a is formed to be greater than the thickness (T2) of the sidewall portion 527b. In various embodiments of the present disclosure, the ratio of T2 to T1 is in a range of 0.5 to 1. In various embodiments of the present disclosure, the second nitride layer 527 is formed of tantalum nitride. In various embodiments of the present disclosure, the second nitride layer 527 is by performing physical vapor deposition (PVD), chemical vapor deposition (CVD), atomic layer deposition (ALD) or plasma-enhanced chemical vapor deposition (PECVD).

In various embodiments of the present disclosure, the third nitride layer 528a is formed on the second nitride layer 527, and the fourth nitride layer 528b is formed on the third nitride layer 528a as shown in FIGS. 5E and 5F. In various embodiments of the present disclosure, the third nitride layer 528a is formed of titanium nitride, and the fourth nitride layer 528b is formed of titanium nitride. In various embodiments of the present disclosure, the third nitride layer 528a and the fourth nitride layer 528b are by performing physical vapor deposition (PVD), chemical vapor deposition (CVD), atomic layer deposition (ALD) or plasma-enhanced chemical vapor deposition (PECVD).

In the operation 505, the gate electrode layer 529 is formed on the second nitride layer 527. In various embodiments of the present disclosure, the third nitride layer 528a and the fourth nitride layer 528b are sequentially sandwiched between the second nitride layer 527 and the gate electrode layer 529.

Referring to FIGS. 5G and 5H, the gate electrode layer 529 is formed of an alloy layer 529a and a metal layer 529b. In FIG. 5G, the alloy layer 529a is formed on the fourth nitride layer 528b. In FIG. 5H, the metal layer 529b is formed on the alloy layer 529a. In various embodiments of the present disclosure, the alloy layer 529a and the metal layer 529b are by performing a sputtering process, a plating process, an evaporation process, physical vapor deposition (PVD), chemical vapor deposition (CVD), atomic layer deposition (ALD) or plasma-enhanced chemical vapor deposition (PECVD).

In accordance with some embodiments, the present disclosure discloses a semiconductor device including a first capping layer and a second capping layer. The first capping layer having a roughened surface may enhance the formation of the second capping layer, so as to form the second capping layer having different thicknesses of a bottom portion and a sidewall portion. In various embodiments of the present disclosure, the thickness of the bottom portion is formed to be greater than the thickness of the sidewall portion, so that the dielectric property of the second capping layer may be significantly improved.

In accordance with some embodiments, the present disclosure disclosed a method for fabricating a semiconductor device. In this method, a first capping layer is etched by an oxidizing solution including an etching solution and an oxidant. In various embodiments of the present disclosure, the first capping layer is formed of titanium nitride which may react with the oxidizing solution, so as to form a roughened surface. In various embodiments of the present disclosure, the roughened surface of the first capping layer is formed several hydroxyl (—OH) groups thereon, and these hydroxyl (—OH) groups may enhance the formation of tantalum nitride to form a second capping layer. Because the formation of tantalum nitride in the bottom portion of the second capping layer is faster than the formation of tantalum nitride in the sidewall portion of the second capping layer, the thickness of the bottom portion is formed to be greater than the thickness of the sidewall portion.

In various embodiments of the present disclosure, the first nitride layer in the semiconductor device is formed of titanium nitride (TiN). The nature of titanium nitride may be oxidized by the oxidant of the etching solution. For example, TiN may react with DIW to generate titanium dioxide ($TiO_2$), and then $TiO_2$ may further react with HF in the etching solution to generate titanium hexafluoride anion ($TiF_6^{2-}$), and then $TiF_6^{2-}$ may solute in the etching solution to be removed, so that the first nitride layer may form the roughened surface.

After the operation of forming the roughened surface of the first nitride layer, the roughened surface may be formed of $Ti(OH)_3$, $TiO_2$ and TiN, so that the roughened surface of the first nitride layer is forming a plurality of hydroxyl (—OH) groups on the roughened surface. When hydroxyl groups are formed on the roughened surface of the first nitride layer, the hydroxyl groups may catch more ammonia ($NH_3$) on the first nitride layer, and then pentakis-dimethylamino tantalum (PDMAT) is added to form a tantalum nitride layer as a second nitride layer. The second nitride layer is formed on the roughened surface of the first nitride layer and the spacer pair. The second nitride layer is formed to have a bottom portion and a sidewall portion. In various embodiments of the present disclosure, the thickness of the bottom portion is formed to be greater than the thickness of the sidewall portion.

In some embodiments of the present disclosure, a semiconductor device includes a substrate including a plurality of spacer pairs, and a plurality of gate stacks disposed on the substrate and individually disposed between the spacer pairs, each one of the gate stacks. The gate stacks includes a dielectric layer disposed on the substrate, a first capping layer having a roughened surface and disposed on the dielectric layer, a second capping layer having a bottom portion disposed on the roughened surface of the first capping layer and a sidewall portion peripherally enclosed by the spacer pairs, and a gate electrode layer covering the second capping layer. In the semiconductor device, the thickness of the bottom portion is greater than the thickness of the sidewall portion.

In some embodiments of the present disclosure, a method for manufacturing a semiconductor device includes several operations. A gate stack and a spacer pair are formed on a substrate. The spacer pair is formed on sidewalls of the gate stack, and the gate stack is sequentially formed of a dielectric layer, a first capping layer and a polysilicon layer. The polysilicon layer of the gate stack is removed. A roughened surface of the first capping layer is formed. A second capping layer is formed on the roughened surface of the first capping layer and the space pair. The second capping layer is formed to have a bottom portion and a sidewall portion, and the thickness of the bottom portion is formed to be greater than the thickness of the sidewall portion. A gate electrode layer is formed on the second capping layer.

In some embodiments of the present disclosure, a method for manufacturing a semiconductor device includes several operations. A gate stack and a spacer pair are formed on a substrate. The spacer pair is formed on sidewalls of the gate stack, and the gate stack is sequentially formed of a dielectric layer, a first nitride layer and a polysilicon layer. The polysilicon layer of the gate stack is removed. A wet-etching process and an oxidation of the first nitride layer are performed by an etching solution and an oxidant to form a roughened surface of the first nitride layer. The roughened surface is formed to have a plurality of hydroxyl group (—OH). A second nitride layer is formed on the roughened surface of the first nitride layer and the space pair. The second nitride layer is formed to have a bottom portion and a sidewall portion, and the thickness of the bottom portion is formed to be greater than the thickness of the sidewall portion. A gate electrode layer is formed on the second capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing a semiconductor device, comprising:
    forming a gate stack and a spacer pair on a substrate, wherein the spacer pair is formed on sidewalls of the gate stack, and the gate stack is sequentially formed of a dielectric layer, a first capping layer and a polysilicon layer;
    removing the polysilicon layer of the gate stack;
    forming a roughened surface of the first capping layer;

forming a second capping layer on the roughened surface of the first capping layer and the spacer pair, wherein the second capping layer is formed to have a bottom portion and a sidewall portion, and the thickness of the bottom portion is formed to be greater than the thickness of the sidewall portion; and forming a gate electrode layer on the second capping layer.

2. The method of claim 1, wherein forming the first capping layer is forming a first nitride layer.

3. The method of claim 1, wherein forming the roughened surface of the first capping layer is performing a wet-etching process and an oxidation of the first capping layer by an oxidizing solution.

4. The method of claim 3, wherein the oxidizing solution includes an oxidant and an etching solution.

5. The method of claim 1, wherein forming the roughened surface of the first capping layer is forming a plurality of hydroxyl (—OH) groups on the roughened surface.

6. The method of claim 1, wherein forming the second capping layer is forming a second nitride layer.

7. The method of claim 1, wherein forming the roughened surface of the first capping layer is forming a roughened surface having a surface roughness (Rz) in a range of $4E^{-6}$-$3.3E^{-5}$ μm.

8. The method of claim 1, after forming a second capping layer, further comprising forming a plurality of capping layers sandwiched between the second capping layer and the gate electrode layer, wherein the capping layers include a third capping layer disposed on the second capping layer and a fourth capping layer disposed on the third capping layer.

9. The method of claim 8, wherein the material of the first capping layer and the third capping layer includes titanium nitride (TiN).

10. The method of claim 8, wherein the material of the second capping layer and the fourth capping layer includes tantalum nitride (TaN).

11. The method of claim 1, wherein the material of the gate electrode layer is one selected from the group consisting of tungsten (W), copper (Cu), titanium (Ti), silver (Ag), aluminum (Al), titanium aluminide (TiAl), titanium aluminum nitride (TiAlN), tantalum carbide (TaC), tantalum cyanide (TaCN), tantalum silicon nitride (TaSiN), manganese (Mn), zirconium (Zr) and the combination thereof.

12. The method of claim 1, wherein the gate electrode layer is a multi-layer, wherein the multi-layer includes an alloy layer disposed on the second capping layer and a metal layer disposed on the alloy layer.

13. A method for manufacturing a semiconductor device, comprising:
    forming a gate stack and a spacer pair on a substrate, wherein the spacer pair is formed on sidewalls of the gate stack, and the gate stack is sequentially formed of a dielectric layer, a first nitride layer and a polysilicon layer;
    removing the polysilicon layer of the gate stack;
    performing a wet-etching process and an oxidation of the first nitride layer by an etching solution and an oxidant to form a roughened surface of the first nitride layer, wherein the roughened surface is formed to have a plurality of hydroxyl group (—OH);
    forming a second nitride layer on the roughened surface of the first nitride layer and the spacer pair, wherein the second nitride layer is formed to have a bottom portion and a sidewall portion, and the thickness of the bottom portion is formed to be greater than the thickness of the sidewall portion; and
    forming a gate electrode layer on the second capping layer.

14. The method of claim 13, wherein the etching solution includes a fluorine compound, and the oxidant includes water ($H_2O$), sodium hydroxide (NaOH) or potassium hydroxide (KOH).

15. The method of claim 13, wherein the first nitride layer is formed of titanium nitride (TiN).

16. The method of claim 13, wherein the second nitride layer is formed of tantalum nitride (TaN).

17. The method of claim 13, wherein forming the roughened surface of the first capping layer is forming a roughened surface having a surface roughness (Rz) in a range of $4E^{-6}$-$3.3E^{-5}$ μm.

18. A method for manufacturing a semiconductor device, comprising:
    forming a gate stack and a spacer pair on a substrate, wherein the spacer pair is formed on sidewalls of the gate stack, and the gate stack is sequentially formed of a dielectric layer, a first nitride layer and a polysilicon layer;
    removing the polysilicon layer of the gate stack;
    performing a wet-etching process and an oxidation of the first nitride layer by an etching solution and an oxidant to form a roughened surface of the first nitride layer, wherein the roughened surface is formed to have a plurality of hydroxyl group (—OH) and a surface roughness (Rz) in a range of $4E^{-6}$-$3.3E^{-5}$ μm;
    forming a second nitride layer on the roughened surface of the first nitride layer and the space pair, wherein the second nitride layer is formed to have a bottom portion and a sidewall portion, and the thickness of the bottom portion is formed to be greater than the thickness of the sidewall portion; and
    forming a gate electrode layer on the second capping layer.

19. The method of claim 18, wherein the etching solution includes a fluorine compound, and the oxidant includes water ($H_2O$), sodium hydroxide (NaOH) or potassium hydroxide (KOH).

20. The method of claim 18, wherein the first nitride layer is formed of titanium nitride (TiN), and the second nitride layer is formed of tantalum nitride (TaN).

* * * * *